(12) United States Patent
Morishita

(10) Patent No.: US 11,336,281 B2
(45) Date of Patent: May 17, 2022

(54) OUTPUT MODULE FOR INDUSTRIAL CONTROL SYSTEM

(71) Applicant: DENSO WAVE INCORPORATED, Chita-gun (JP)

(72) Inventor: Takeru Morishita, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 0 days.

(21) Appl. No.: 17/321,589

(22) Filed: May 17, 2021

(65) Prior Publication Data

US 2021/0359683 A1 Nov. 18, 2021

(30) Foreign Application Priority Data

May 18, 2020 (JP) ............... JP2020-086672

(51) Int. Cl.
*H03K 17/965* (2006.01)
*H03K 17/735* (2006.01)
*H03K 17/66* (2006.01)

(52) U.S. Cl.
CPC ......... *H03K 17/965* (2013.01); *H03K 17/661* (2013.01); *H03K 17/735* (2013.01)

(58) Field of Classification Search
None
See application file for complete search history.

(56) References Cited

U.S. PATENT DOCUMENTS

| 10,281,528 | B2 * | 5/2019 | Pizzuti | G01R 15/20 |
| 10,340,683 | B2 * | 7/2019 | Murakami | H02H 7/205 |
| 10,778,210 | B2 * | 9/2020 | Kamiya | H02H 3/05 |
| 10,985,653 | B1 * | 4/2021 | Cai | F02N 11/0814 |
| | | | | 123/179.4 |
| 2010/0116236 | A1 * | 5/2010 | Yamaguchi | F02N 11/0814 |
| | | | | 123/179.4 |
| 2012/0194226 | A1 * | 8/2012 | Itou | H03K 17/168 |
| | | | | 327/109 |
| 2015/0057822 | A1 * | 2/2015 | Baldridge | H03K 17/691 |
| | | | | 700/293 |

(Continued)

FOREIGN PATENT DOCUMENTS

JP 2019-020822 A 2/2019

*Primary Examiner* — Thomas J. Hiltunen
*Assistant Examiner* — Khareem E Almo
(74) *Attorney, Agent, or Firm* — Oliff PLC

(57) ABSTRACT

An output module for a PLC includes an output circuit. This output circuit is open or closed selectively between a power supply terminal (to which a power supply voltage is supplied) and an output terminal (connected to a solenoid). The output module includes a control apparatus which controls the operation of the output circuit. The output circuit includes switches connected in series to each other between the power supply terminal and the output terminal, and a current output section which performs an operation of short-circuiting terminals of the switch to pass a predetermined current through a path formed due to the short-circuiting. The control apparatus includes on/off control sections which controls on/off states of the respective switches, and diagnosis sections which perform a diagnosis on presence of a short-circuit fault in the respective switches based on diagnostic signals output from a low-potential terminal of the switches.

6 Claims, 8 Drawing Sheets

(56) References Cited

U.S. PATENT DOCUMENTS

| | | | |
|---|---|---|---|
| 2017/0237381 A1* | 8/2017 | Shinohara | H02P 29/0241 |
| | | | 318/400.27 |
| 2017/0365997 A1* | 12/2017 | Kitamoto | H02H 9/02 |
| 2019/0068088 A1* | 2/2019 | Xu | G05B 9/02 |
| 2019/0109534 A1* | 4/2019 | Okonogi | F02D 41/22 |
| 2019/0165611 A1* | 5/2019 | Miyazawa | H02M 1/32 |
| 2019/0179283 A1* | 6/2019 | Maekawa | G01R 31/52 |
| 2019/0260372 A1* | 8/2019 | Kamiya | H03K 17/0828 |
| 2020/0096571 A1* | 3/2020 | Hanai | H01H 47/004 |
| 2020/0228109 A1* | 7/2020 | Bachhuber | H03K 17/0828 |
| 2020/0259321 A1* | 8/2020 | Morishita | H02H 3/05 |
| 2020/0321774 A1* | 10/2020 | Chen | H01H 47/004 |
| 2021/0156330 A1* | 5/2021 | Giri | H02H 7/205 |
| 2021/0273634 A1* | 9/2021 | Djelassi-Tscheck | |
| | | | H03K 17/0822 |
| 2021/0359683 A1* | 11/2021 | Morishita | H03K 17/735 |

\* cited by examiner

⟨TIME PERIOD T1⟩

<TIME PERIOD T2>

<TIME PERIOD T3>

⟨TIME PERIOD T4⟩

OUTPUT MODULE FOR INDUSTRIAL CONTROL SYSTEM

CROSS-REFERENCE TO RELATED APPLICATION

This application is based on and claims the benefit of priority from earlier Japanese Patent Application No. 2020-086672 filed May 18, 2020, the description of which is incorporated herein by reference.

BACKGROUND

Technical Field

The present disclosure relates to output modules for industrial control systems. More specifically, the present disclosure relates to such output modules having an output circuit configured to be open or closed between a power supply terminal (i.e., a terminal to which a supply voltage is supplied) and an output terminal connected to an external electrical load.

Related Art

As disclosed in JP 2019-20822 A, conventional industrial control systems, such as programmable logic controllers, are provided with an output module configured to perform predetermined output control based on a command signal from a CPU module which controls the overall operation of such an industrial controller. In this specification, the term "programmable logic controller" may be abbreviated as "PLC".

Examples of the output control include controlling the supply of power to an external electrical load. An output module for performing such output control includes an output circuit configured to be open or closed selectively between a power supply terminal (i.e., a terminal to which a supply voltage is supplied) and an output terminal connected to an external electrical load. For multiplexing of output control, the output circuit typically includes two switches (e.g., FETs) which are connected in series to each other between the power supply terminal and the output terminal and are turned on or off selectively in the same manner.

Problems to be Solved

In terms of functional safety, an output module of a PLC is required to have an output circuit which is able to perform a self-diagnostic function of periodically determining whether an output circuit thereof properly interrupts power to an external electrical load, that is, a function which turns the output circuit off. Furthermore, such an output module configured as described above is required to determine whether two switches of the output circuit can be independently turned off, or in other words, a short-circuit fault is not occurring in these switches. This diagnosis is conventionally performed by independently turning off two switches in order. Such a diagnostic technique is hereinafter referred to as conventional technique.

The conventional technique involves diagnosing the presence of a short-circuit fault based on a diagnostic signal corresponding to a switch independently turned off. This diagnostic signal is an output signal from a low-potential terminal of each switch. Specifically, the conventional technique involves diagnosing a short-circuit fault as not occurring, in response to a low-level diagnostic signal corresponding to a predetermined switch having been turned off.

Such a conventional technique requires a high-side switch (i.e., one of the switches closer to the power supply terminal than the other switch is) to be turned on when diagnosing the presence of a short-circuit fault in, for example, a low-side switch (i.e., the other switch closer to the output terminal than the high-side switch is). This operation may be performed when the low-side switch has a short-circuit fault. In this case, power may be supplied to an external electrical load through a current path formed between the power supply terminal and the output terminal when the high-side switch is on. Consequently, the external electrical load may unintentionally operate.

SUMMARY

The present disclosure has been made in view of the above circumstances. It is an object of the present disclosure to provide an output module used for an industrial control system and capable of preventing the supply of power to an external electrical load during diagnosis of an output circuit.

An output module for an industrial control system, recited in a first exemplary embodiment, includes an output circuit and a control apparatus. The output circuit is configured to be open or closed between a power supply terminal (i.e., a terminal to which a power supply voltage is supplied) and an output terminal connected to an external electrical load. The control apparatus is configured to control the operation of the output circuit. The output circuit includes a plurality of switches including a high-side switch and a low-side switch connected in series to each other between the power supply terminal and the output terminal. The high-side switch is disposed closer to the power supply terminal than the low-side switch is. The output circuit also includes a current output section configured to perform an operation of short-circuiting terminals of the high-side switch to pass a limited current through a path formed due to the short-circuiting. The limited current having a value less than or equal to that of a predetermined off current. The control apparatus includes first and second on/off (i.e., switching) control sections, an operation control section, and first and second diagnosis sections. The first on/off control section is configured to cause the high-side switch to be turned on or off selectively, while the second on/off control section is configured to cause the low-side switch to be turned on or off selectively. The operation control section is configured to cause the current output section to perform or stop the operation. The first diagnosis section is configured to perform a diagnosis on the presence of a short-circuit fault in the high-side switch based on a diagnostic signal output from a low-potential terminal of the high-side switch, while the second diagnosis section is configured to diagnose the presence of a short-circuit fault in the low-side switch based on a diagnostic signal output from a low-potential terminal of the low-side switch.

In the above configuration, the terminals of the high-side switch are short-circuited upon operation of the current output section, whereby the output circuit is in a state similar to that when the high-side switch is on. Therefore, with the above configuration, a diagnosis requiring the high-side switch to be turned on in the conventional technique (e.g., a diagnosis of the presence of a short-circuit fault in the low-side switch) may be performed by causing the current output section to perform the operation instead of turning on the high-side switch.

With this configuration, even if the low-side switch has a short-circuit fault, a current flowing through a path from the power supply terminal to the output terminal will be a current output by the current output section, that is, a limited current having a value less than or equal to that of an off current. The off current has a predetermined value less than a lower limit on a range of current values at which an external electrical load is operable. Such a configuration enables a diagnosis of the output circuit equivalent to the conventional technique and prevents the external electrical load from being supplied with power during diagnosis of the output circuit and thereby unintentionally operating.

According to the output module for an industrial control system, recited in a second exemplary embodiment, the first diagnosis section diagnoses the presence of a short-circuit fault in the high-side switch based on the first diagnostic signal obtained during a first time period and the first diagnostic signal obtained during a second time period. During the first time period, the first on/off control section turns off the high-side switch, and the operation control section causes the current output section to stop the operation. During the first time period, the level of the first diagnostic signal will be low as long as an abnormal condition such as a supply fault (i.e., a signal path from the low-potential terminal of the high-side switch to the first diagnosis section is short-circuited to a location to which a power supply voltage or the like is supplied) is not occurring and a short-circuit fault is not occurring in the high-side switch.

During the second time period, the first on/off control section and the second on/off control section turn off the high-side switch and the low-side switch, respectively, and the operation control section causes the current output section to perform the operation. During the second time period, the level of the first diagnostic signal will be high as long as an abnormal condition such as a ground fault (i.e., the signal path from the low-potential terminal of the high-side switch to the first diagnosis section is short-circuited to a site to which serves as a ground potential or the like) is not occurring. Thus, the first diagnosis section diagnoses the high-side switch as not having a short-circuit fault upon determining that the level of the first diagnostic signal obtained during the first time period is low and the level of the first diagnostic signal obtained during the second time period is high.

According to the output module for an industrial control system, recited in a third exemplary embodiment, the diagnosis section diagnoses the presence of a short-circuit fault in the low-side switch based on the second diagnostic signal obtained during a third time period and the second diagnostic signal obtained during a fourth time period. The low-side switch is disposed closer to the output terminal than the high-side switch is. During the third time period, the first on/off control section turns off the high-side switch, the second on/off control section turns on the low-side switch, and the operation control section causes the current output section to perform the operation. During the third time period, the level of the second diagnostic signal will be high as long as an abnormal condition such as the ground fault is not occurring in the signal path from the low-potential terminal of the low-side switch to the second diagnosis section.

During the fourth time period, the first on/off control section and the second on/off control section turn off the high-side switch and the low-side switch, respectively, and the operation control section causes the current output section to perform the operation. During the fourth time period, the level of the second diagnostic signal will be low as long as an abnormal condition such as the supply fault is not occurring in the signal path from the low-potential terminal of the low-side switch to the second diagnosis section. Thus, the second diagnosis section diagnoses the low-side switch as not having a short-circuit fault upon determining that the level of the second diagnostic obtained during the third time period is high and the level of the second diagnostic signal obtained during the fourth time period is low.

According to the output module for an industrial control system, recited in a fourth exemplary embodiment, the control apparatus includes a first control unit and a second control unit. The first control unit includes the first on/off control section and the second diagnosis section. The second control unit includes the second on/off control section and the first diagnosis section. Such an arrangement provides the following effect.

That is, as long as a switch has no faults and is functionally normally, a diagnostic signal corresponding to the switch will represent the same logic as a control signal output from an on/off control section for controlling the on/off states of the switch. In cases where the on/off control section and the diagnosis section corresponding to a switch are provided in the same control unit, the output terminal of the control unit for outputting a control signal and the input terminal thereof for receiving a diagnostic signal may be located close to each other. In this case, when there is a short fault (i.e., terminals of the switch are short-circuited), the control signal and the diagnostic signal may have the same logic state regardless of whether there is a fault in the switch, possibly leading to an error diagnosis such that the switch is diagnosed as being normal when there is actually a fault in the switch.

In contrast, with the configuration described above, the first on/off control section and the second diagnosis section are provided in the first control unit, while the second control unit includes the second on/off control section and the first diagnosis section are provided in the second control unit. With this arrangement, the output terminal for outputting a control signal corresponding to a switch and the input terminal for receiving a diagnostic signal corresponding to the switch are not located close to each other, thereby providing a low incidence of the erroneous diagnosis described above.

DETAILED DESCRIPTION OF THE PREFERRED EMBODIMENTS

Figure 1:
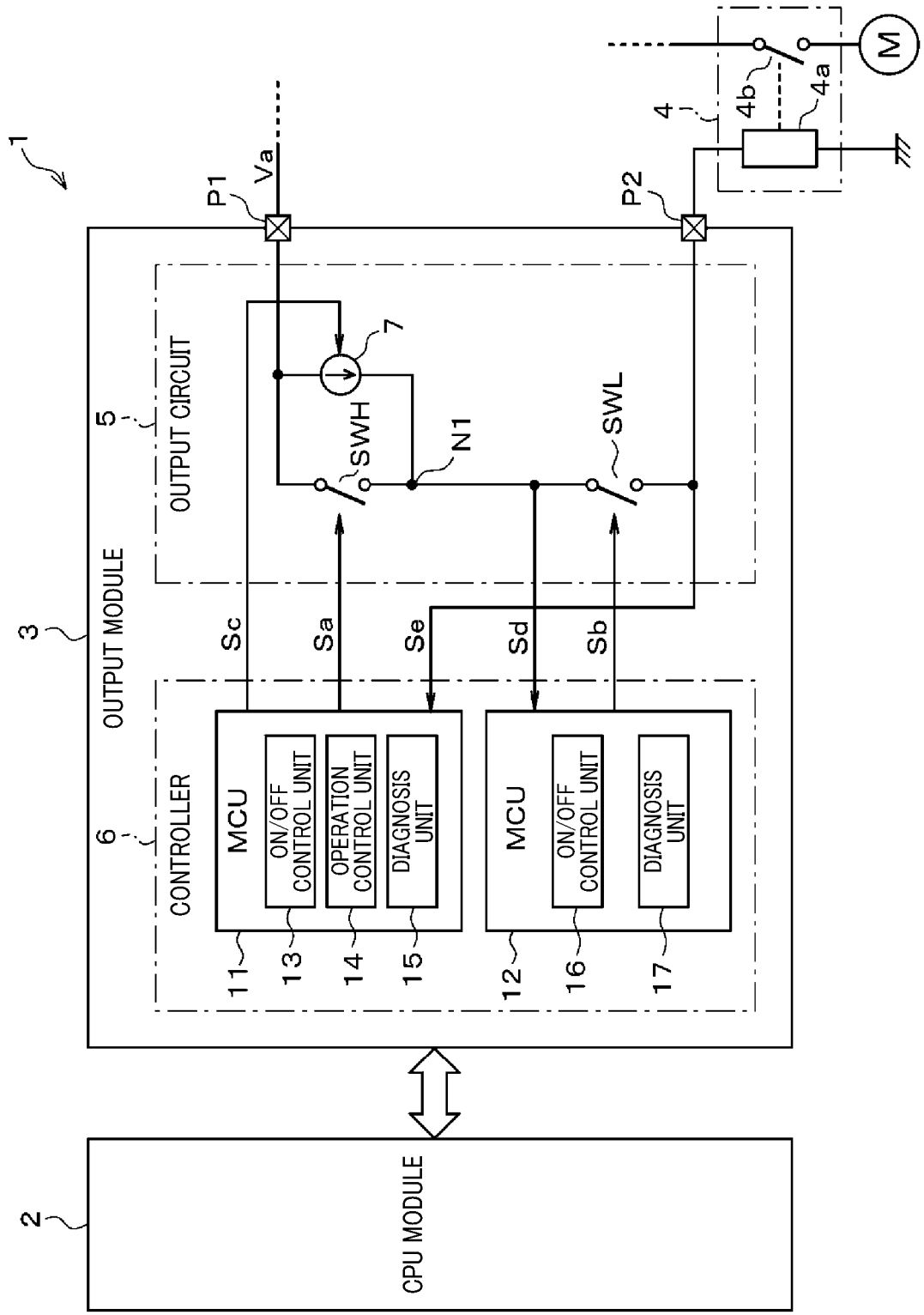
FIG. 1 schematically illustrates the configuration of a PLC according to a first embodiment.

Embodiments of the present disclosure will now be described with reference to the drawings. In these embodiments, like reference characters designate substantially the same components, and description thereof will be omitted.

First Embodiment

The first embodiment of the present disclosure will now be described with reference to FIGS. 1 to 7.

As illustrated in FIG. 1, a PLC 1, which is an industrial control system, includes a CPU module 2, an output module 3, and an input module (not illustrated). The CPU module 2 controls the overall operation of the PLC 1. The PLC 1 controls, for example, the operation of a motor M provided in an industrial robot or the like. Respective modules of the PLC 1, including the CPU module 2 and the output module 3, are configured to communicate therebetween via a bus.

The output module 3 controls the supply of power, or more specifically a power supply voltage Va, to a solenoid 4 (external electrical load) based on a command signal from the CPU module 2. The solenoid 4 includes a coil 4a and a contact 4b. The coil 4a is connected between an output terminal P2 (described later) and ground (0 V). The contact 4b is closed when energized by the coil 4a. The contact 4b is provided to selectively open or close a path of power to the motor M.

The output module 3 is a digital output module having a power supply terminal P1, the output terminal P2, an output circuit 5, and a control apparatus 6. The power supply terminal P1 receives a power supply voltage Va of, for example, +24 V. The output terminal P2 is connected to the solenoid 4 (external electrical load). The output circuit 5 includes two switches SWH and SWL and a current output section 7. The output circuit 5 is configured to be open or closed selectively between the power supply terminal P1 and the output terminal P2. The switches SWH and SWL are connected in series to each other between the power supply terminal P1 and the output terminal P2.

The switch SWH is disposed closer to the power supply terminal P1 than the switch SWL is. The switch SWH corresponds to a high-side switch. The switch SWL is disposed closer to the output terminal P2 than the switch SWH is. The switch SWL corresponds to a low-side switch. In the present embodiment, the switches SWH and SWL are semiconductor switching elements (e.g., MOSFETs). The switches SWH and SWL may be, for example, mechanical relays.

The switch SWH is turned on or off selectively in response to a binary control signal Sa from the control apparatus 6. Specifically, the switch SWH is turned on in response to a high-level control signal Sa and turned off in response to a low-level control signal Sa. The switch SWL is turned on or off selectively in response to a binary control signal Sb from the control apparatus 6. Specifically, the switch SWL is turned on in response to a high-level control signal Sb and turned off in response to a low-level control signal Sb. During normal operation of the output module 3, the control signals Sa and Sb are equivalent signals, and the switches SWH and SWL are turned on or off selectively in response to the respective control signals Sa and Sb in the same manner.

The current output section 7 is a constant current source for supplying a constant current. The current output section 7 is connected between the power supply terminal P1 and a node N1, which is a point of interconnection between the switches SWH and SWL. In other words, the current output section 7 is connected in parallel to the switch SWH. The current output section 7 is configured to be switchable between a state of performing an operation of passing a current and a state of stopping this operation. The states of the current output section 7 are controlled by a control signal Sc from the control apparatus 6. Specifically, the current output section 7 performs the operation of passing a current upon receiving a high-level control signal Sc, and stops this operation upon receiving a low-level control signal Sc.

During operation of the current output section 7, terminals of the switch SWH are short-circuited. The current output section 7 is configured to pass a limited current having a value less than or equal to that of a predetermined off current. The predetermined off current has a value less than a lower limit on a range of current values at which the contact 4b is closed and the solenoid 4 is operable. The lower limit on this range may be, for example, approximately 0.5 mA. Thus, the current output section 7 configured as described above is capable of performing an operation of short-circuiting terminals of the switch SWH to pass the limited current through a path formed due to the short-circuiting.

In the output circuit 5 configured as described above, an output signal from a low-potential terminal of the switch SWH (i.e., a terminal closer to the node N1 than the other switch is) is supplied to the control apparatus 6 as a diagnostic signal Sd. The diagnostic signal Sd is a read-back signal for determination of the presence of a fault in the output circuit 5. In the output circuit 5 configured as described above, an output signal from a low-potential terminal of the switch SWL (i.e., a terminal closer to the output terminal P2 than the other terminal is) is supplied to the control apparatus 6 as a diagnostic signal Se. The diagnostic signal Se is a read-back signal for determination of the presence of a fault in the output circuit 5.

The control apparatus 6 controls the operation of the output circuit 5. The control apparatus 6 includes a MCU 11 and a MCU 12. The control apparatus 6 controls the operation of the output circuit 5. The control apparatus 6 includes a MCU 11 and a MCU 12. The control apparatus 6 controls the operation of the output circuit 5. The control apparatus 6 includes a MCU 11 and a MCU 12. The IC is an abbreviation for Integrated Circuit. The MCUs 11 and 12 are respectively provided for the switches SWH and SWL. The MCUs 11 and 12 are respectively provided for the switches SWH and SWL.

The MCU 11 includes an on/off (i.e., switching) control section 13, an operation control section 14, and a diagnosis section 15. The on/off control section 13, operation control section 14 and diagnosis section 15 are implemented by causing a CPU of the MCU 11 to run computer programs stored in a ROM to thereby execute processes corresponding to the programs (i.e., implemented by software). Alternatively, the on/off control section 13, operation control section 14 and diagnosis section 15 may be implemented by hardware or a combination of software and hardware.

The on/off control section 13 controls the on/off states of the switch SWH. The on/off control section 13 generates a control signal Sa described above. The control signal Sa is supplied to the switch SWH via an output terminal of the MCU 11. The operation control section 14 causes the current output section 7 to perform or stop the operation. The operation control section 14 generates a control signal Sc described above. The control signal Sc is supplied to the current output section 7 via the output terminal of the MCU 11.

The diagnosis section 15 diagnoses the presence of a short-circuit fault in the switch SWL based on a diagnostic signal Se. The control signal Se is supplied to the diagnosis section 15 via an input terminal of the MCU 11. The input terminal of the MCU 11 for receiving the diagnostic signal Se is provided with a pull-down resistor connected to ground. Specifically, the diagnosis section 15 determines the level of a diagnostic signal Se supplied thereto via an A/D converter provided in the MCU 11 and diagnoses the presence of a short-circuit fault in the switch SWL based on the determined level of the diagnostic signal Se.

The MCU 12 includes an on/off control section 16 and a diagnosis section 17. The on/off control section 16 and diagnosis section 17 are implemented by causing a CPU of the MCU 12 to run computer programs stored in a ROM to thereby execute processes corresponding to the programs (i.e., implemented by software). Alternatively, the on/off control section 16 and diagnosis section 17 may be implemented by hardware or a combination of software and hardware.

The on/off control section 16 controls the on/off states of the switch SWL. The on/off control section 16 generates a control signal Sb described above. The control signal Sb is supplied to the switch SWL via an output terminal of the MCU 12. The diagnosis section 17 diagnoses the presence of a short-circuit fault in the switch SWH based on a diagnostic signal Sd. The control signal Sd is supplied to the diagnosis section 17 via an input terminal of the MCU 12. The input terminal of the MCU 12 for receiving the control signal Sd is provided with a pull-down resistor connected to ground. Specifically, the diagnosis section 17 determines the level of a diagnostic signal Sd supplied thereto via an A/D converter provided in the MCU 12, and diagnoses the presence of a short-circuit fault in the switch SWH based on the determined level of the diagnostic signal Sd.

Thus, the control apparatus 6 includes the on/off control sections 13 and 16 provided for the respective switches SWH and SWL, and further includes the diagnosis sections 15 and 17 provided for the respective switches SWH and SWL. With this arrangement, the MCU 11 includes the on/off control section 13 and the diagnosis section 15. The on/off control section 13 corresponds to the switch SWH, while the diagnosis section 15 corresponds to the switch SWL. In addition, the MCU 12 includes the on/off control section 16 and the diagnosis section 17. The on/off control section 16 corresponds to the switch SWL, while the diagnosis section 17 corresponds to the switch SWH.

The diagnosis section 17 diagnoses the presence of a short-circuit fault in the switch SWH based on a diagnostic signal Sd obtained during a time period T1 corresponding to a first time period and a diagnostic signal Sd obtained during a time period T2 corresponding to a second time period. During the time period T1, the on/off control sections 13 and 16 turn off the switches SWH and SWL, respectively, and the operation control section 14 causes the current output section 7 to stop the operation. During the time period T1, the on/off control section 16 may alternatively turn on the switch SWL. During the time period T2, the on/off control sections 13 and 16 turn off the switches SWH and SWL, respectively, and the operation control section 14 causes the current output section 7 to perform the operation.

The diagnosis section 15 diagnoses the presence of a short-circuit fault in the switch SWL based on a diagnostic signal Se obtained during a time period T3 corresponding to a third time period and a diagnostic signal Se obtained during a time period T4 corresponding to a fourth time period. During the time period T3, the on/off control section 13 turns off the switch SWH, the on/off control section 16 turns on the switch SWL, and the operation control section 14 causes the current output section 7 to perform the operation. During the time period T4, the on/off control sections 13 and 16 turn off the switches SWH and SWL, respectively, and the operation control section 14 causes the current output section 7 to perform the operation. In the present embodiment, the diagnosis section 17 diagnoses the presence of a short-circuit fault in the switch SWH before the diagnosis section 15 diagnoses the presence of a short-circuit fault in the switch SWL.

A process for diagnosing the presence of a fault in the switches SWH and SWL by the diagnosis sections 15 and 17 of the present embodiment will now be described with reference to FIGS. 2 to 7. In FIGS. 2 to 7, the high level and low level of the control signals Sa, Sb and Sc and diagnostic signals Sd and Se are indicated as H and L, respectively. The connectors A shown in FIGS. 2 and 3 indicate that the process of FIG. 2 continues to the process of FIG. 3.

Figure 4:
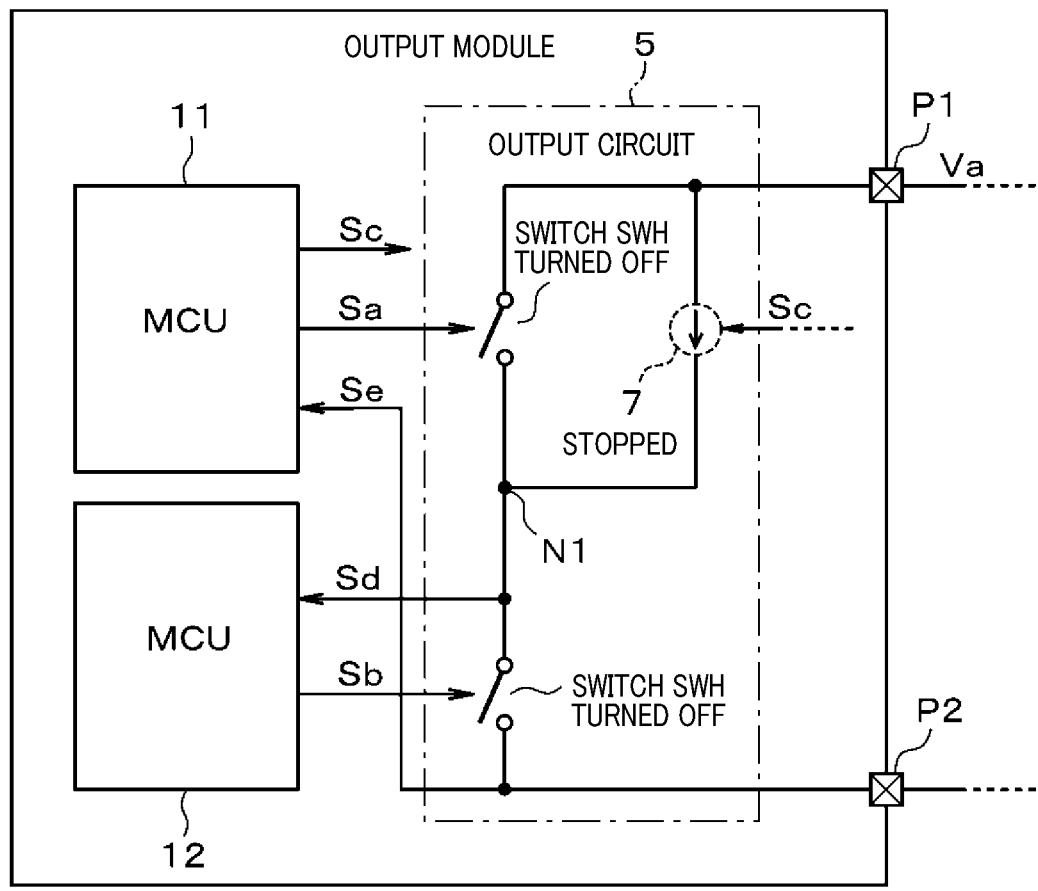
FIG. 4 illustrates a state of an output circuit during a first time period according to the first embodiment.

The present diagnosis process starts with performing the step S101. In the step S101, the control signals Sa, Sb and Sc are each set to a low level. As shown in FIG. 4, performing the step S101 causes the switches SWH and SWL to be turned off and the current output section 7 to stop the operation. The time period T1 described above corresponds to a time period during which the on/off states of the switches SWH and SWL and the operation of the current output section 7 are thus controlled.

During the time period T1, the level of a diagnostic signal Sd determined by the diagnosis section 17 will be low as long as an abnormal condition such as a supply fault (i.e., a signal path from the low-potential terminal of the switch SWH to the diagnosis section 17 of the MCU 12 is short-circuited to a site to which a power supply voltage Va or the like is supplied) is not occurring and a short-circuit fault is not occurring in the switch SWH. Based on this point, the present diagnosis process proceeds as follows. After the step S101, control proceeds to step S102. In the step S102, the diagnosis section 17 determines whether the level of the diagnostic signal Sd is low.

If the level of the diagnostic signal Sd is determined not as low (i.e., determined as high), the result of the step S102 will be NO and control proceeds to step S103. In this case, it is considered that the level of the diagnostic signal Sd is not low, as would normally occur, due to the supply fault or the like in the signal path of the diagnostic signal Sd or a short-circuit fault in the switch SWH, and thus an abnormal condition occurs in which the diagnosis section 17 fails to determine the low level of the diagnostic signal Sd. Therefore, in the step S103, it is determined that the diagnosis based on the diagnostic signal Sd cannot be performed normally, that is, an abnormal condition occurs in the diagnostic function of the diagnosis section 17. After the step S103, the present diagnosis process terminates.

If the level of the diagnostic signal Sd is determined as low, the result of the step S102 will be YES and control proceeds to step S104. In the step S104, it is determined that the level of the diagnostic signal Sd is low during the time period T1 and thus the diagnosis section 17 is capable of determining the low level of the diagnostic signal Sd. After the step S104, control proceeds to step S105. In the step S105, the control signals Sa and Sb are each set to a low level and the control signal Sc is set to a high level.

Figure 5:
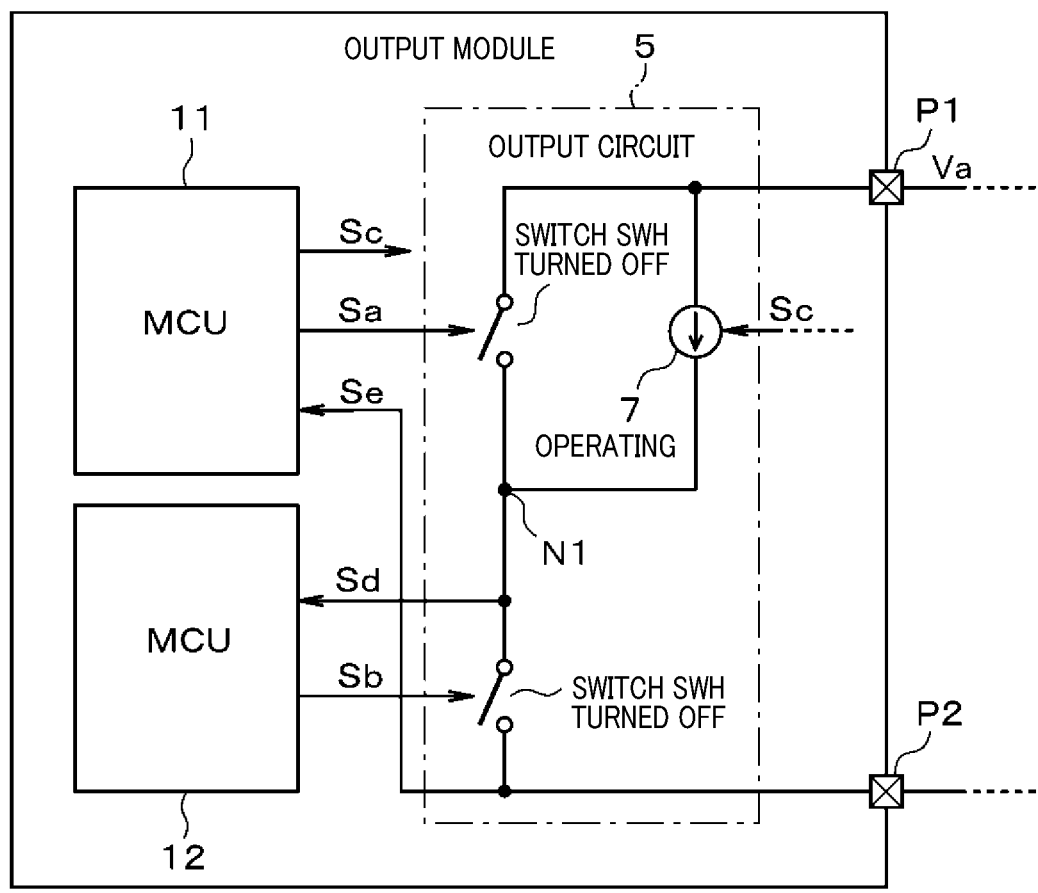
FIG. 5 illustrates a state of the output circuit during a second time period according to the first embodiment.

As shown in FIG. 5, performing the step S105 causes the switches SWH and SWL to be turned off and the current output section 7 to perform the operation. The time period T2 described above corresponds to a time period during which the on/off states of the switches SWH and SWL and the operation of the current output section 7 are thus controlled. During the time period T2, the level of a diagnostic signal Sd determined by the diagnosis section 17 will be high due to a limited current flowing from the current output section 7 to the pull-down resistor as long as an abnormal condition such as a ground fault (i.e., the signal path from the low-potential terminal of the switch SWH to the diagnosis section 17 of the MCU 12 is short-circuited to a site which serves as a ground potential or the like) is not occurring. Based on this point, the present diagnosis process proceeds as follows.

After the step S105, control proceeds to step S106. In the step S106, the diagnosis section 17 determines whether the level of the diagnostic signal Sd is high. If the level of the diagnostic signal Sd is determined not as high (i.e., determined as low), the result of the step S106 will be NO and control proceeds to step S103. In this case, it is considered that the level of the diagnostic signal Sd is not high, as would normally occur, due to the ground fault or the like in the signal path of the diagnostic signal Sd, and thus an abnormal condition occurs in which the diagnosis section 17 fails to determine the high level of the diagnostic signal Sd. Therefore, in the step S103, it is determined that the diagnosis based on the diagnostic signal Sd cannot be performed normally, that is, an abnormal condition occurs in the diagnostic function of the diagnosis section 17.

If the level of the diagnostic signal Sd is determined as high, the result of the step S106 will be YES and control proceeds to step S107. In the step S107, it is determined that the level of the diagnostic signal Sd is high during the time period T2 and thus the diagnosis section 17 is capable of determining the high level of the diagnostic signal Sd. After the step S107, control proceeds to step S108. In the step S108, the control signals Sa, Sb and Sc are each set to a low level as in the step S101.

Therefore, performing the step S108 causes the on/off states of the switches SWH and SWL and the operation of the current output section 7 to be controlled as in the time period T1 shown in FIG. 4. After the step S108, control proceeds to step S109. In the step S109, the diagnosis section 17 determines whether the level of the diagnostic signal Sd is low. If the level of the diagnostic signal Sd is determined not to be low (i.e., determined to be high), the result of the step S109 will be NO and control proceeds to step S110.

In this case, the YES result of the step S102 eliminates the possibility that the supply fault or the like is occurring in the signal path of the diagnostic signal Sd. Therefore, in the step S110, the switch SWH is determined as having a short-circuit fault, that is, being stuck in a closed state. After the step S110, the present diagnosis process terminates. If the level of the diagnostic signal Sd is determined as low, the result of the step S109 will be YES and control proceeds to step S111. In the step S111, it is determined that the switch SWH has no short-circuit faults and the switch SWH can be turned on, that is, normally opened.

During the time period T1, the level of a diagnostic signal Se determined by the diagnosis section 15 will be low as long as an abnormal condition such as a supply fault (i.e., a signal path from the low-potential terminal of the switch SWL to the diagnosis section 15 is short-circuited to a site to which a power supply voltage Va or the like is supplied) is not occurring and a short-circuit fault is not occurring in the switch SWL. Based on this point, the present diagnosis process proceeds as follows. After the step S111, control proceeds to step S112 shown in FIG. 3. In the step S112, it is determined whether the level of the diagnostic signal Se is low.

If the level of the diagnostic signal Se is determined not as low (i.e., determined as high), the result of the step S112 will be NO and control proceeds to step S113. In this case, it is considered that the level of the diagnostic signal Se is not low, as would normally occur, due to the supply fault or the like in the signal path of the diagnostic signal Se or a short-circuit fault in the switch SWL, and thus an abnormal condition occurs in which the diagnosis section 15 fails to determine the low level of the diagnostic signal Se. Therefore, in the step S113, it is determined that the diagnosis based on the diagnostic signal Se cannot be performed normally, that is, an abnormal condition occurs in the diagnostic function of the diagnosis section 15. After the step S113, the present diagnosis process terminates.

If the level of the diagnostic signal Se is determined as low, the result of the step S112 will be YES and control proceeds to step S114. In the step S114, it is determined that the level of the diagnostic signal Se is low during the time period T1 and thus the diagnosis section 15 is capable of determining the low level of the diagnostic signal Se. After the step S114, control proceeds to step S115. In the step S115, the control signal Sa is set to a low level, while the control signals Sb and Sc are each set to a high level.

Figure 6:
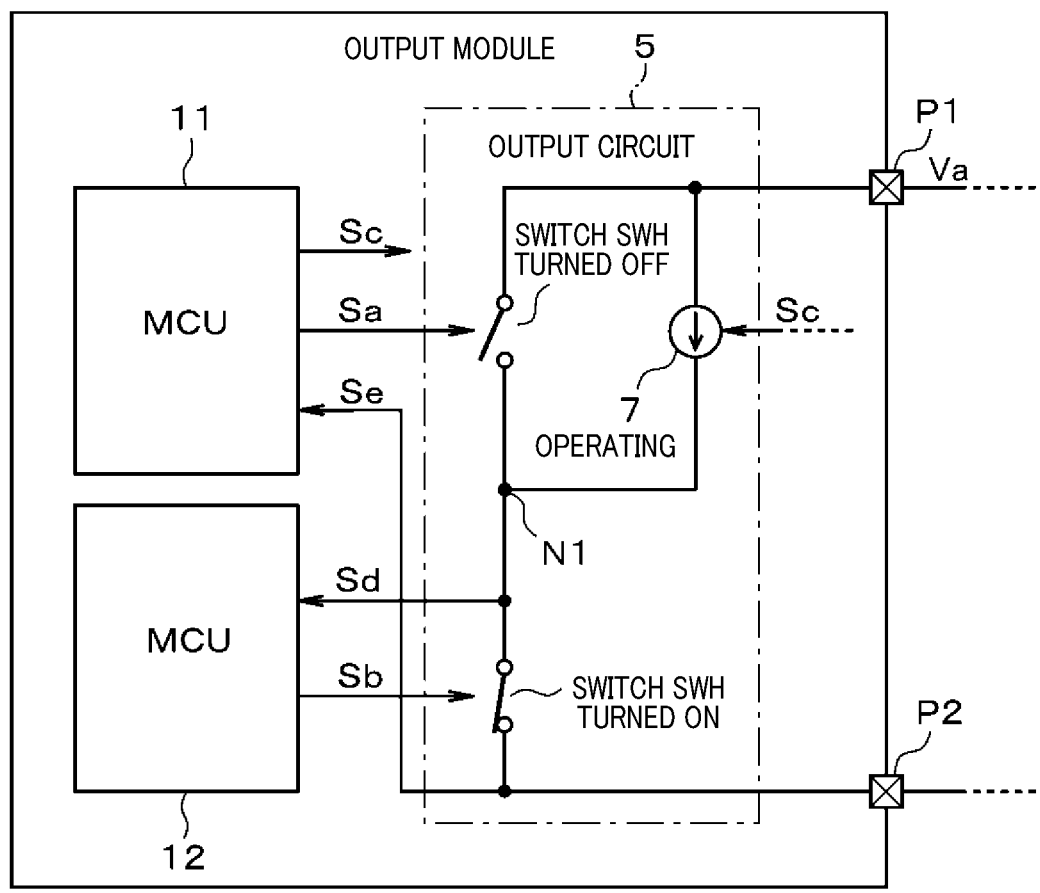
FIG. 6 illustrates a state of the output circuit during a third time period according to the first embodiment.

As shown in FIG. 6, performing the step S115 causes the switch SWH to be turned off, the switch SWL to be turned on, and the current output section 7 to perform the operation. The time period T3 described above corresponds to a time period during which the on/off states of the switches SWH and SWL and the operation of the current output section 7 are thus controlled. During the time period T3, the level of a diagnostic signal Se determined by the diagnosis section 15 will be high due to a limited current flowing from the current output section 7 to the pull-down resistor as long as the ground fault or the like is not occurring in the signal path from the low-potential terminal of the switch SWL to the diagnosis section 15 of the MCU 11. Based on this point, the present diagnosis process proceeds as follows.

After the step S115, control proceeds to step S116. In the step S116, the diagnosis section 15 determines whether the level of the diagnostic signal Se is high. If the level of the diagnostic signal Se is determined not as high (i.e., determined as low), the result of the step S116 will be NO and control proceeds to step S113. In this case, it is considered that the level of the diagnostic signal Se is not high, as would normally occur, due to the ground fault or the like in the signal path of the diagnostic signal Se, and thus an abnormal condition occurs in which the diagnosis section 15 fails to determine the high level of the diagnostic signal Se. Therefore, in the step S113, it is determined that the diagnosis based on the diagnostic signal Se cannot be performed normally, that is, an abnormal condition occurs in the diagnostic function of the diagnosis section 15.

During the time period T3, the current output section 7 operates to pass a leak current flowing from the power supply terminal P1 to the solenoid 4 via the output terminal P2. The leak current corresponds to the above-described limited current passed by the current output section 7. As described above, the current output section 7 passes a limited current having a value less than or equal to that of an off current having a value less than a lower limit on a range of current values at which the solenoid 4 is operable.

Therefore, the solenoid 4 will not operate during the time period T3. If the level of the diagnostic signal Se is determined as high, the result of the step S116 will be YES and control proceeds to step S117.

Figure 7:
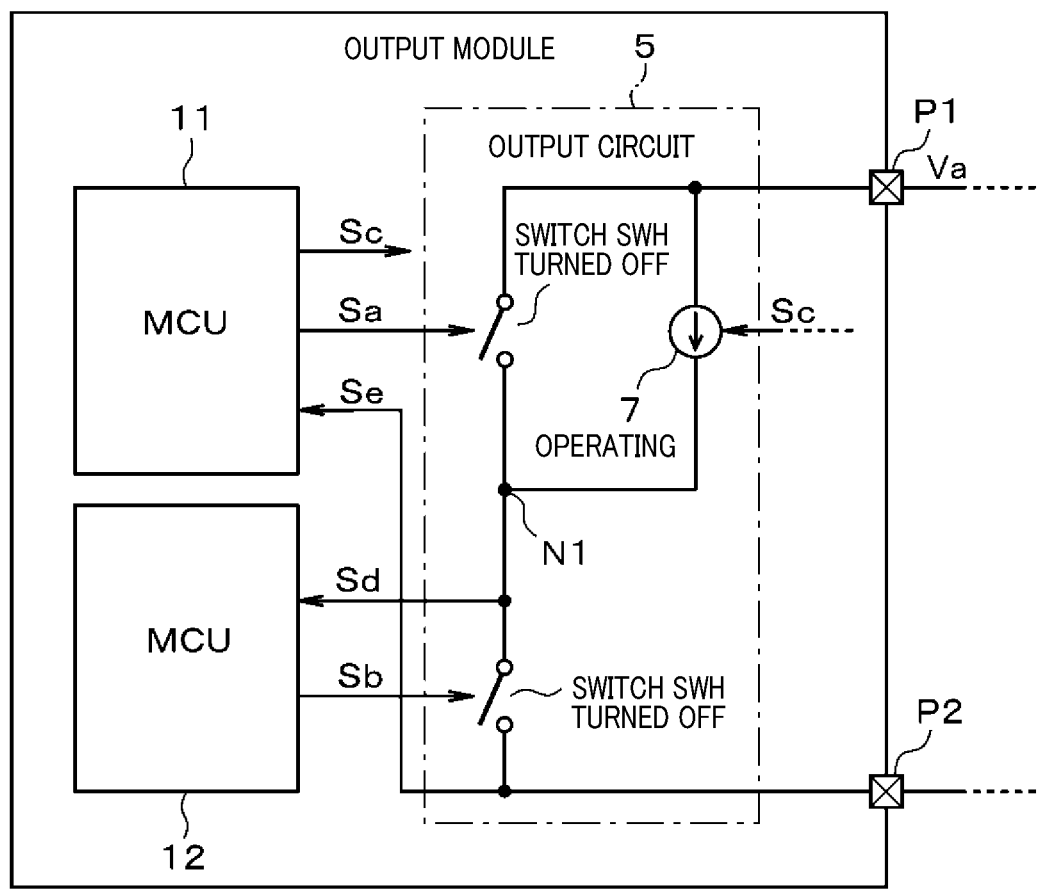
FIG. 7 illustrates a state of the output circuit during a fourth time period according to the first embodiment.

In the step S117, it is determined that the level of the diagnostic signal Se is high during the time period T3 and thus the diagnosis section 15 is capable of determining the high level of the diagnostic signal Se. After the step S117, control proceeds to step S118. In the step S118, the control signals Sa and Sb are each set to a low level and the control signal Sc is set to a high level. As shown in FIG. 7, performing the step S118 causes the switches SWH and SWL to be turned off and the current output section 7 to perform the operation.

The time period T4 described above corresponds to a time period during which the on/off states of the switches SWH and SWL and the operation of the current output section 7 are thus controlled. During the time period T4, the level of a diagnostic signal Se determined by the diagnosis section 15 will be low as long as the supply fault or the like is not occurring in the signal path from the low-potential terminal of the switch SWL to the diagnosis section 15 and a short-circuit fault is not occurring in the switch SWL. Based on this point, the present diagnosis process proceeds as follows.

After the step S118, control proceeds to step S119. In the step S119, the diagnosis section 15 determines whether the level of the diagnostic signal Se is low. If the level of the diagnostic signal Se is determined not as low (i.e., determined as high), the result of the step S119 will be NO and control proceeds to step S120. In this case, the YES result of the step S112 eliminates the possibility that the supply fault or the like is occurring in the signal path of the diagnostic signal Se.

Therefore, in the step S120, the switch SWL is determined as having a short-circuit fault, that is, being stuck in a closed state. After the step S120, the present diagnosis process terminates. If the level of the diagnostic signal Se is determined as low, the result of the step S119 will be YES and control proceeds to step S121. In the step S121, it is determined that the switch SWL has no shot-circuit faults and the switch SWL can be turned on, that is, normally opened. After the step S121, the present diagnosis process terminates.

As described above, with the configuration of the present embodiment, the terminals of the switch SWH (i.e., high-side switch) are short-circuited upon operation of the current output section 7, whereby the output circuit 5 is in a state similar to that when the switch SWH is on. Therefore, with the above configuration, a diagnosis requiring a high-side switch to be turned on in the conventional technique (e.g., a diagnosis of the presence of a short-circuit fault in the low-side switch) is performed by causing the current output section 7 to perform the operation instead of turning on the switch SWH (i.e., high-side switch).

With this configuration, even if the switch SWL (i.e., low-side switch) has a short-circuit fault, a current flowing through a path from the power supply terminal P1 to the output terminal P2 will be a current passed by the current output section 7, that is, a limited current having a value less than or equal to that of an off current. The off current has a value less than a lower limit on a range of current values at which the solenoid 4 is operable. Such a configuration enables a diagnosis of the output circuit 5 equivalent to the conventional technique, and prevents the solenoid 4 from being supplied with power during diagnosis of the output circuit 5 and thereby unintentionally operating.

The diagnosis section 17 diagnoses the presence of a short-circuit fault in the switch SWH based on a diagnostic signal Sd obtained during the time period T1 and a diagnostic signal Sd obtained during the time period T2. During the time period T1, the switch SWH is turned off, and the current output section 7 is caused to stop the operation. During the time period T1, the level of a diagnostic signal Se will be low as long as an abnormal condition such as the supply fault is not occurring in the signal path from the low-potential terminal of the switch SWH to the diagnosis section 17 and a short-circuit fault is not occurring in the switch SWH.

During the time period T2, the switches SWH and SWL are turned off, and the current output section 7 is caused to perform the operation. During the time period T2, the level of a diagnostic signal Sd will be high as long as an abnormal condition such as the ground fault is not occurring in the signal path from the low-potential terminal of the switch SWH to the diagnosis section 17. Thus, the diagnosis section 17 diagnoses the switch SWH as not having a short-circuit fault upon determining that the level of the diagnostic signal Sd during the time period T1 is low and the level of the diagnostic signal Sd during the time period T2 is high.

The diagnosis section 15 diagnoses the presence of a short-circuit fault in the switch SWL based on a diagnostic signal Se obtained during a time period T3 and a diagnostic signal Se obtained during a time period T4. During the time period T3, the switch SWH is turned off, the switch SWL is turned on, and the current output section 7 is caused to perform the operation. During the time period T3, the level of a diagnostic signal Se will be high as long as an abnormal condition such as the ground fault is not occurring in the signal path from the low-potential terminal of the switch SWL to the diagnosis section 15.

During the time period T4, the switches SWH and SWL are turned off, and the current output section 7 is caused to perform the operation. During the time period T4, the level of a diagnostic signal Se will be low as long as an abnormal condition such as the supply fault is not occurring in the signal path from the low-potential terminal of the switch SWL to the diagnosis section 15 and a short-circuit fault is not occurring in the switch SWL. Thus, the diagnosis section 15 diagnoses the switch SWL as not having a short-circuit fault upon determining that the level of the diagnostic signal Se during the time period T3 is high and the level of the diagnostic signal Se during the time period T4 is low.

In the configuration described above, the diagnostic signals Sd and Se may indicate an abnormal level due to a break or a short in wirings included in signal paths of the signals, a short at an output terminal of the MCUs 11 and 12 for outputting the signals, or a fault in an internal circuit of the MCUs 11 and 12. Examples of such an abnormal condition of the diagnostic signals Sd and Se include a state of being stuck in a high level and a state of being stuck in a low level.

Due to such an abnormal condition of the diagnostic signals Sd and Se, the diagnoses by the diagnosis sections 15 and 17 based on the signals may be performed abnormally, possibly leading to an error diagnosis on the presence of a short-circuit in the switches SWH and SWL. To address this concern, in the present embodiment, the diagnoses on the presence of a short-circuit fault in the switches SWH and SWL are performed after it is determined that the diagnostic signals Sd and Se are normal, or in other words, diagnostic functions of the diagnosis sections 15 and 17 are normal. This configuration prevents the occurrence of an error diagnosis due to an abnormal condition of the diagnosis signals Sd and Se.

In the above configuration, while the diagnosis on the presence of a short-circuit fault in the switch SWH is performed regardless of whether there is a short-circuit fault in the switch SWL, the diagnosis on the presence of a short-circuit fault in the switch SWL may decrease in accuracy due to a short-circuit fault in the switch SWH. To address this concern, in the present embodiment, the diagnosis section 17 diagnoses the presence of a short-circuit fault in the switch SWH before the diagnosis section 15 diagnoses the presence of a short-circuit fault in the switch SWL. This enables the diagnosis on the presence of a short-circuit fault in the switch SWL to be performed accurately because it has been determined that there is no short-circuit fault in the switch SWH.

In the above configuration, the control apparatus 6 includes the MCUs 11 and 12. The MCU 11 includes the on/off control section 13 and the diagnosis section 15. The on/off control section 13 corresponds to the switch SWH, while the diagnosis section 15 corresponds to the switch SWL. The MCU 12 includes the on/off control section 16 and the diagnosis section 17. The on/off control section 16 corresponds to the switch SWL, while the diagnosis section 17 corresponds to the switch SWH. Such an arrangement provides the following effect.

That is, when, for example, the switch SWH has no faults and is normal, the diagnostic signal Sd corresponding to the switch SWH will represent the same logic as the control signal Sa output from the on/off control section 13 for controlling the on/off states of the switch SWH. In cases where the on/off control section 13 and the diagnosis section 17 corresponding to the switch SWH are provided in the same MCU, the output terminal of the MCU for outputting a control signal Sa and the input terminal thereof for receiving a diagnostic signal Sd may be located close to each other.

This arrangement increases a probability of occurrence of a short fault (i.e., terminals of the switch SWH are short-circuited). When there is such a short fault, the control signal Sa and the diagnostic signal Sd may represent the same logic regardless of whether there is a short-circuit fault in the switch SWH, possibly leading to an error diagnosis such that the switch SWH is diagnosed as being normal when there is actually a fault in the switch SWH. In contrast, with the configuration of the present embodiment, the on/off control section 13 and the diagnosis section 17 corresponding to the switch SWH are provided in the MCUs 11 and 12, respectively. With this arrangement, the output terminal for outputting a control signal Sa and the input terminal for receiving a diagnostic signal Sd are not located close to each other.

Further, with the configuration of the present embodiment, the on/off control section 16 and the diagnosis section 15 corresponding to the switch SWL are provided in the MCUs 11 and 12, respectively. With this arrangement, the output terminal for outputting a control signal Sb and the input terminal for receiving a diagnostic signal Se are not located close to each other. Thus, with the configuration of the present embodiment, a short fault is unlikely to occur between the output terminal of the control signal Sa and the input terminal of the diagnostic signal Sd and between the output terminal of the control signal Sb and the input terminal of the diagnostic signal Se. Consequently, the present configuration provides a low incidence of the error diagnosis described above.

Second Embodiment

Figure 8:
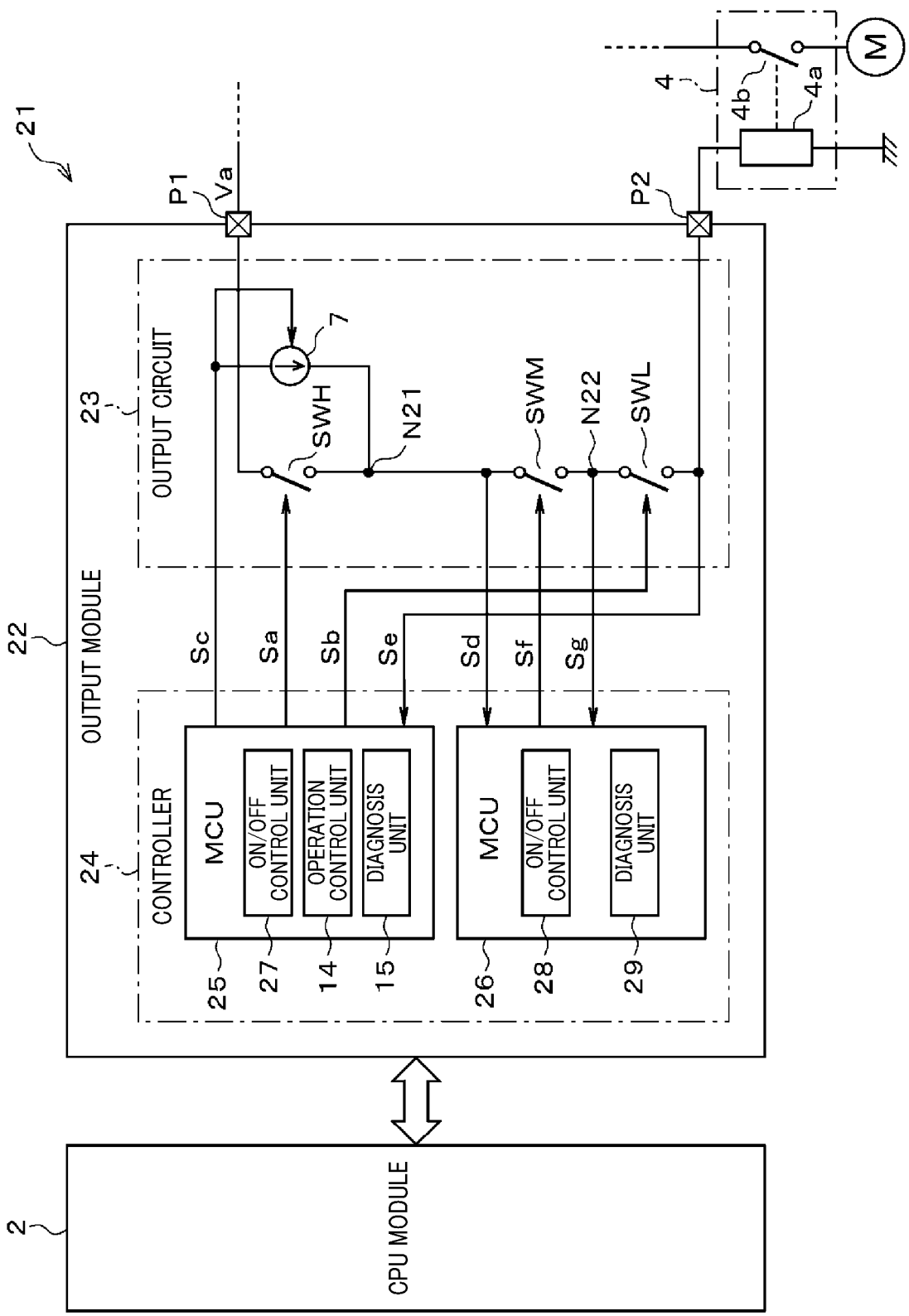
FIG. 8 schematically illustrates the configuration of a PLC according to a second embodiment.

The second embodiment of the present disclosure will now be described with reference to FIG. 8. As shown in FIG. 8, an output module 22 of a PLC 21 according to the present embodiment differs from the output module 3 of the first embodiment in that the output module 22 includes an output circuit 23 instead of the output circuit 5 and a control apparatus 24 instead of the control apparatus 6.

The output circuit 23 differs from the output circuit 5 in that it also includes a switch SWM. In the output circuit 23, the switches SWH, SWM and SWL are disposed in this order and connected in series to each other between the power supply terminal P1 and the output terminal P2. The switch SWM is closer to the output terminal P2 than the switch SWH (i.e., a high-side switch) is. The switch SWM corresponds to the low-side switch.

The switch SWH is turned on or off selectively in response to a binary control signal Sa from the control apparatus 24 as in the first embodiment. The switch SWM is turned on or off selectively in response to a binary control signal Sf from the control apparatus 24. Specifically, the switch SWM is turned on in response to a high-level control signal Sf and turned off in response to a low-level control signal Sf. The switch SWL is turned on or off selectively in response to a binary control signal Sb from the control apparatus 24 as in the first embodiment. During normal operation of the output module 22, the control signals Sa, Sb and Sf are equivalent signals, and the switches SWH, SWM and SWL are turned on or off selectively in response to the respective control signals Sa, Sb and Sf in the same manner.

The current output section 7 is connected between the power supply terminal P1 and a node N21, which is a point of interconnection between the switches SWH and SWM. In other words, the current output section 7 is connected in parallel to the switch SWH. In the output circuit 23 configured as described above, an output signal from a low-potential terminal of the switch SWH (i.e., a terminal closer to the node N21 than the other terminal is) is supplied to the control apparatus 24 as a diagnostic signal Sd as in the first embodiment.

In the output circuit 23 configured as described above, an output signal from a low-potential terminal of the switch SWM (i.e., a terminal closer to a node 22 (a point of interconnection between the switches SWM and SWL) than the other terminal is) is supplied to the control apparatus 24 as a diagnostic signal Sg. The diagnostic signal Sg is a read-back signal for determination of the presence of a fault in the output circuit 23. In the output circuit 23 configured as described above, an output signal from a low-potential terminal of the switch SWL (i.e., a terminal closer to the output terminal P2 than the other terminal is) is supplied to the control apparatus 24 as a diagnostic signal Se as in the first embodiment.

The control apparatus 24 differs from the control apparatus 6 in that it includes MCUs 25 and 26 instead of the MCUs 11 and 12. The MCU 25 differs from the MCU 11 in that it includes an on/off control section 27 instead of the on/off control section 13. The on/off control section 27 controls the on/off states of the switch SWH as with the on/off control section 13. The on/off control section 27 also controls the operation of the switch SWL. The on/off control section 27 generates a control signal Sb. The control signal Sb is supplied to the switch SWL via an output terminal of the MCU 25.

The MCU 26 differs from the MCU 12 in that it includes an on/off control section 28 instead of the on/off control section 16 and a diagnosis section 29 instead of the diagnosis section 17. The on/off control section 28 controls the on/off states of the switch SWM. The on/off control section 28 generates a control signal Sf described above. The control signal Sf is supplied to the switch SWM via an output terminal of the MCU 26. The diagnosis section 29 diagnoses the presence of a short-circuit fault in the switch SWH based on a diagnostic signal Sd as with the diagnosis section 17. The diagnosis section 29 diagnoses the presence of a short-circuit fault in the switch SWM based on a diagnostic signal Sg.

The control signal Sg is supplied to the diagnosis section 29 via an input terminal of the MCU 26. The input terminal of the MCU 26 for receiving the diagnostic signal Sg is provided with a pull-down resistor connected to ground. Specifically, the diagnosis section 29 determines the level of a diagnostic signal Sg supplied thereto via an A/D converter provided in the MCU 26, and diagnoses the presence of a short-circuit fault in the switch SWM based on the determined level of the diagnostic signal Sg.

The diagnosis section 29 diagnoses the presence of a short-circuit fault in the switch SWH based on a diagnostic signal Sd obtained during a time period T21 corresponding to the first time period and a diagnostic signal Sd obtained during a time period T22 corresponding to the second time period. During the time period T21, the on/off control sections 27 and 28 turn off the switches SWH, SWM and SWL and the operation control section 14 causes the current output section 7 to stop the operation. During the time period T22, the on/off control sections 27 and 28 turn off the switches SWH, SWM and SWL and the operation control section 14 causes the current output section 7 to perform the operation.

The diagnosis section 29 diagnoses the presence of a short-circuit fault in the switch SWM based on a diagnostic signal Sg obtained during a time period T23 corresponding to the third time period and a diagnostic signal Sg obtained during a time period T24 corresponding to the fourth time period. During the time period T23, the on/off control section 27 turns off the switches SWH and SWL, the on/off control section 28 turns on the switch SWM, and the operation control section 14 causes the current output section 7 to perform the operation. During the time period T24, the on/off control sections 27 and 28 turn off the switches SWH, SWM and SWL and the operation control section 14 causes the current output section 7 to perform the operation.

The diagnosis section 15 diagnoses the presence of a short-circuit fault in the switch SWL based on a diagnostic signal Se obtained during a time period T25 corresponding to the third time period and a diagnostic signal Se obtained during a time period T26 corresponding to the fourth time period. During the time period T25, the on/off control section 27 turns off the switch SWH and turns on the switch SWL, the on/off control section 28 turns on the switch SWM, and the operation control section 14 causes the current output section 7 to perform the operation. During the time period T26, the on/off control sections 27 and 28 turn off the switches SWH, SWM and SWL and the operation control section 14 causes the current output section 7 to perform the operation.

In the present embodiment, the diagnosis section 29 diagnoses the presence of a short-circuit fault in the switch SWH before it diagnoses the presence of a short-circuit fault in the switch SWM. Further, in the present embodiment, the diagnosis section 29 diagnoses the presence of a short-circuit fault in the switch SWM before it diagnoses the presence of a short-circuit fault in the switch SWL.

Such processes for diagnosing the presence of a fault in the switches SWH, SWM and SWL performed by the diagnosis sections 15 and 29 are provided by adding steps corresponding to the switch SWM to the diagnosis processes (shown in FIGS. 2 and 3) performed by the diagnosis sections 15 and 17 of the first embodiment. The steps corresponding to the switch SWM are equivalent to those corresponding to the switch SWL (shown in FIG. 3). The steps corresponding to the switch SWM are performed following the process shown in FIG. 2, that is, the steps corresponding to the switch SWH.

According to the above-described configuration of the present embodiment, the number of switches configured to be open or closed between the power supply terminal P1 and the output terminal P2 increases from two to three compared to the first embodiment, and a function to diagnose the presence of a short-circuit fault is modified to accommodate the increased number of switches. Accordingly, the present embodiment employs the same diagnosis method as that of the first embodiment, achieving the same effect as the first embodiment.

Other Embodiments

The present disclosure is not limited to the embodiments described above and illustrated in the accompanying drawings. Various modifications, combinations, and expansions may be made thereto without departing from the spirit and scope of the present disclosure. The values indicated in the embodiments described above are illustrative and should not be construed in a limiting sense.

At least one of the functional blocks in the MCU 11 may be provided in the MCU 12. At least one of the functional blocks in the MCU 12 may be provided in the MCU 11. For example, the MCU 11 may include the on/off control section 13 and the diagnosis section 17, while the MCU 12 may include the on/off control section 16, the operation control section 14 and the diagnosis section 17.

At least one of the functional blocks in the MCU 25 may be provided in the MCU 26. At least one of the functional blocks in the MCU 26 may be provided in the MCU 25. For example, the MCU 25 may include the on/off control section 28 and the diagnosis section 29, while the MCU 25 may include the on/off control section 27, the operation control section 14 and the diagnosis section 15.

Figure 2:
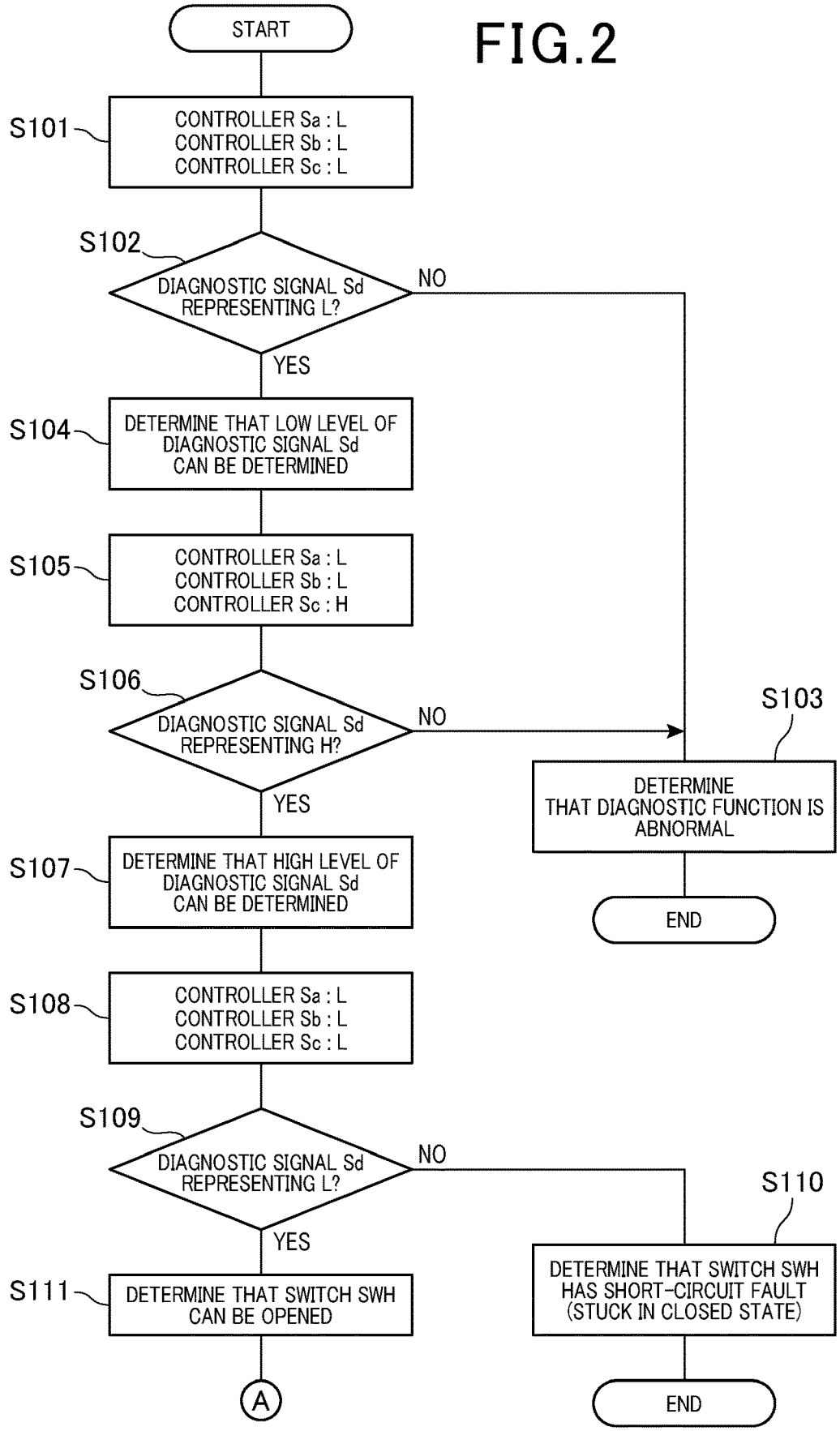
FIG. 2 schematically illustrates a process for diagnosing the presence of a fault in a high-side switch, according to the first embodiment.
Figure 3:
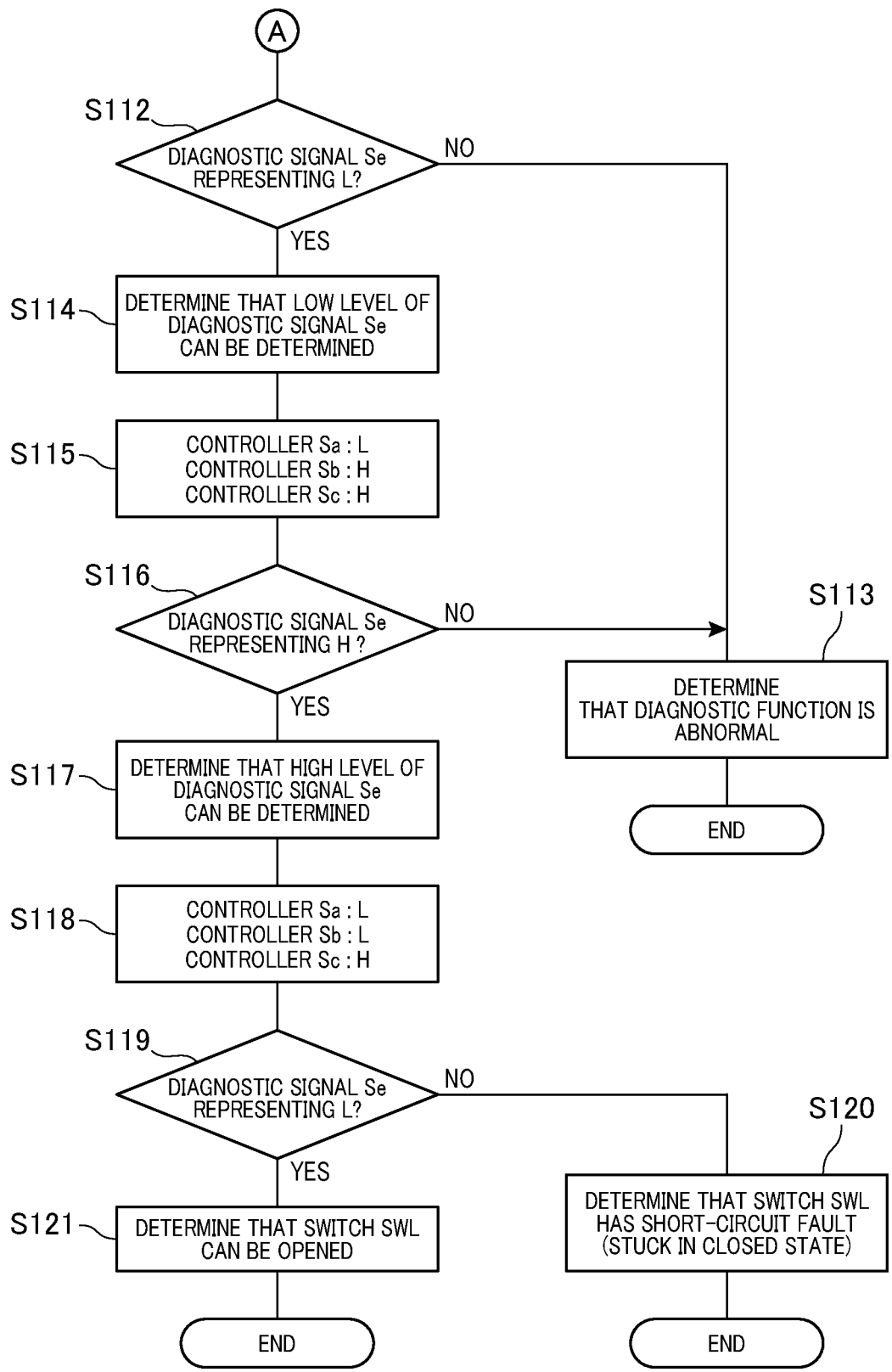
FIG. 3 schematically illustrates a process for diagnosing the presence of a fault in a low-side switch, according to the first embodiment.

The processes for diagnosing the presence of a fault performed by the diagnosis sections 15 and 17 according to the first embodiment and the processes for diagnosing the presence of a fault performed by the diagnosis sections 15 and 29 according to the second embodiment are not limited to those shown in FIGS. 2 and 3, and may be modified as appropriate. For example, regarding the diagnoses on the presence of a fault performed by the diagnosis sections 15 and 17, the diagnosis on the presence of a fault in the switch SWL may be performed before the diagnosis on the presence of a fault in the switch SWH.

The number of switches configured to be open or closed between the power supply terminal P1 and the output terminal P2 is not limited to 2 or 3, and may be 4 or more. In that case, a function to diagnose the presence of a short-circuit fault may be modified to accommodate the increased number of switches. Other than the output modules 3 and 22 of the PLC 1 and 21 and the like, the present disclosure is applicable to output modules for industrial control systems, such as those having an output circuit configured to be open or closed between a power supply terminal (i.e., a terminal to which a supply voltage is supplied) and an output terminal connected to an external electrical load.

What is claimed is:

1. An output module for an industrial control system, comprising:

an output circuit configured to be open or closed between a power supply terminal and an output terminal of the output module, the power supply terminal receiving a power supply voltage, the output terminal being connected to an external electrical load; and a control apparatus configured to control an operation of the output circuit, the output circuit including:

a high-side switch and a low-side switch connected in series to each other between the power supply terminal and the output terminal, the high-side switch being disposed closer to the power supply terminal than the low-side switch is, the low-side switch being disposed closer to the output terminal than the high-side switch is; and a current output section configured to perform an operation of short-circuiting terminals of the high-side switch to pass a limited current through a path formed due to the short-circuiting, the limited current having a value less than or equal to that of a predetermined off current, the control apparatus including:

a first switching control section and a second switching control section, the first switching control section being configured to cause the high-side switch to be turned on or off selectively, the second switching control section being configured to cause the low-side switch to be turned on or off selectively;

an operation control section configured to control the operation of the current output section; and a first diagnosis section and a second diagnosis section, the first diagnosis section being configured to perform a first diagnosis on presence of a short-circuit fault in the high-side switch based on a first diagnostic signal output from a low-potential terminal of the high-side switch, the second diagnosis section being configured to perform a second diagnosis on presence of a short-circuit fault in the low-side switch based on a second diagnostic signal output from a low-potential terminal of the low-side switch.

2. The output module as recited in claim 1, wherein the first diagnosis section is configured to perform the first diagnosis based on the first diagnostic signal obtained during a first time period and the first diagnostic signal obtained during a second time period, the first time period being such that the first switching control section turns off the high-side switch and the operation control section causes the current output section to stop the operation, the second time period being such that the first switching control section and the second switching control section turn off the respective high-side and low-side switches and the operation control section causes the current output section to perform the operation.

3. The output module as recited in claim 1, wherein the second diagnosis section is configured to perform the second diagnosis based on the second diagnostic signal obtained during a third time period and the second diagnostic signal obtained during a fourth time period, the third time period being such that the first switching control section turns off the high-side switch, the second switching control section turns on the low-side switch, and the operation control section causes the current output section to perform the operation, the fourth time period being such that the first switching control section and the second switching control section turn off the respective high-side and low-side switches and the operation control section causes the current output section to perform the operation.

4. The output module as recited in claim 1, wherein the control apparatus includes a first control unit and a second control unit, the first control unit including the first switching control section and the second diagnosis section, the second control unit including the second switching control section and the first diagnosis section.

5. The output module as recited in claim 2, wherein the second diagnosis section is configured to perform the second diagnosis based on the second diagnostic signal obtained during a third time period and the second diagnostic signal obtained during a fourth time period, the third time period being such that the first switching control section turns off the high-side switch, the second switching control section turns on the low-side switch, and the operation control section causes the current output section to perform the operation, the fourth time period being such that the first switching control section and the second switching control section turn off the respective high-side and low-side switches and the operation control section causes the current output section to perform the operation.

6. The output module as recited in claim 2, wherein the control apparatus includes a first control unit and a second control unit, the first control unit including the first switching control section and the second diagnosis section, the second control unit including the second switching control section and the first diagnosis section.

* * * * *